(12) United States Patent
Cao et al.

(10) Patent No.: US 11,075,230 B2
(45) Date of Patent: Jul. 27, 2021

(54) THIN FILM TRANSISTOR, MANUFACTURING METHOD THEREOF, ARRAY SUBSTRATE AND DISPLAY DEVICE

(71) Applicants: Hefei Xinsheng Optoelectronics Technology Co., Ltd., Anhui (CN); BOE Technology Group Co., Ltd., Beijing (CN)

(72) Inventors: Binbin Cao, Beijing (CN); Chengzhi Ye, Beijing (CN); Fangfang Li, Beijing (CN); Hui An, Beijing (CN); Hengbin Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/596,212

(22) Filed: Oct. 8, 2019

(65) Prior Publication Data
US 2020/0119154 A1    Apr. 16, 2020

(30) Foreign Application Priority Data
Oct. 12, 2018 (CN) .......................... 201811186814.3

(51) Int. Cl.
*H01L 27/12* (2006.01)
*H01L 29/49* (2006.01)
*H01L 29/786* (2006.01)

(52) U.S. Cl.
CPC ...... *H01L 27/1251* (2013.01); *H01L 27/1262* (2013.01); *H01L 29/4908* (2013.01); *H01L 29/78603* (2013.01)

(58) Field of Classification Search
CPC . H01L 27/12; H01L 27/1214; H01L 27/1222; H01L 27/124; H01L 27/1248; H01L 27/1251; H01L 27/1259; H01L 27/1262; H01L 27/127; H01L 27/283; H01L 27/305; H01L 27/307; H01L 27/3262; H01L 29/06; H01L 29/0657; H01L 29/0684; H01L 29/0847; H01L 29/1025; H01L 29/1029; H01L 29/1033; H01L 29/1037; H01L 29/1079;

(Continued)

(56) References Cited

U.S. PATENT DOCUMENTS

| 2016/0197099 A1 | 7/2016 | Sasaki |
| 2016/0233251 A1 | 8/2016 | Sasaki |
| 2018/0145185 A1 | 5/2018 | Kim et al. |

FOREIGN PATENT DOCUMENTS

| CN | 105759519 A | 7/2016 |
| CN | 105870125 A | 8/2016 |

OTHER PUBLICATIONS

First Office Action and English language translation, CN Application No. 201811186814.3, dated Mar. 27, 2020, 24 pp.

*Primary Examiner* — Cheung Lee
(74) *Attorney, Agent, or Firm* — Myers Bigel, P.A.

(57) ABSTRACT

A thin film transistor, a manufacturing method thereof, an array substrate and a display device are provided. The thin film transistor includes a first electrode on a substrate, a first insulating layer on the first electrode with the first insulating layer having a sidewall, an active layer on the first insulating layer with the active layer connected to the first electrode and comprising a portion on the sidewall which is configured as a channel of the thin film transistor, and a second electrode on the active layer with the second electrode connected to the active layer.

14 Claims, 10 Drawing Sheets

(58) Field of Classification Search
CPC . H01L 29/401; H01L 29/41; H01L 29/42312;
H01L 29/4232; H01L 29/42376; H01L
29/42384; H01L 29/4908; H01L 29/772;
H01L 29/786; H01L 29/78603
See application file for complete search history.

THIN FILM TRANSISTOR, MANUFACTURING METHOD THEREOF, ARRAY SUBSTRATE AND DISPLAY DEVICE

RELATED APPLICATION

The present application claims the benefit of Chinese Patent Application No. 201811186814.3, filed on Oct. 12, 2018, the entire disclosure of which is incorporated herein by reference.

FIELD

The present disclosure relates to the field of display technologies, and specifically to a thin film transistor, a manufacturing method thereof, an array substrate, and a display device.

BACKGROUND

In recent years, display technologies have been rapidly developed, and corresponding thin film transistor (TFT) technology has evolved from an original amorphous silicon (a-Si) thin film transistor to a metal oxide thin film transistor. An oxide active layer has a carrier mobility that is 20 to 30 times that of an amorphous silicon active layer, thus it has characteristics such as high mobility, high on-state current, better switching property, better uniformity, and the like, and can greatly improve the properties of the thin film transistor, increase the response speed of pixels and achieve a faster refresh rate, so that it is applicable to applications that require fast response and large current.

At present, oxide thin film transistors mainly include two types of transistors: bottom gate type thin film transistors and top gate type thin film transistors. A bottom gate type thin film transistor includes an etch barrier ESL type, a back channel etch BCE type, etc., and is characterized in that a source electrode and a drain electrode cover two sides of the oxide active layer, respectively, and a channel is formed between the source electrode and the drain electrode. A top gate type thin film transistor is characterized in that a source electrode and a drain electrode are connected to the oxide active layer through via holes, respectively. Since there is no overlapping region between the gate electrode and the source/drain electrode of a top gate type thin film transistor, the top gate type thin film transistor has smaller parasitic capacitance, less circuit delay and higher switching speed, and is also simple to manufacture. Therefore, top gate type thin film transistors are widely used in high resolution display devices.

However, practical applications have shown that both bottom gate type and top gate type thin film transistors have deficiencies such as a large channel length, a resulting small turn-on current of the thin film transistor, and the like. Therefore, how to reduce the channel length of a thin film transistor is a technical problem to be solved in the art.

SUMMARY

An aspect of the present disclosure provides a thin film transistor comprising: a first electrode on a substrate; a first insulating layer on the first electrode, the first insulating layer having a sidewall; an active layer on the first insulating layer, the active layer being connected to the first electrode and comprising a portion located on the sidewall which is configured as a channel of the thin film transistor; and a second electrode on the active layer, the second electrode being connected to the active layer.

According to some exemplary embodiments of the present disclosure, the first insulating layer has a groove exposing at least a portion of the first electrode, the active layer comprises a U-shaped portion within the groove and a conductive portion outside the groove, and the U-shaped portion comprises a connection portion at a bottom of the groove and connected to the first electrode, and a channel portion on a sidewall of the groove.

According to some exemplary embodiments of the present disclosure, the above thin film transistor further comprises: a second insulating layer covering the U-shaped portion; a control electrode on the second insulating layer; a third insulating layer on the control electrode, the third insulating layer having a via hole exposing the conductive portion. The second electrode is located on the third insulating layer and is connected to the conductive portion through the via hole.

According to some exemplary embodiments of the present disclosure, an orthographic projection of the second insulating layer, an orthographic projection of the control electrode, and an orthographic projection of the U-shaped portion on the substrate coincide with each other.

According to some exemplary embodiments of the present disclosure, the conductive portion comprises a first conductive portion and a second conductive portion on two sides of the groove, the via hole in the third insulating layer comprises a first via hole exposing the first conductive portion and a second via hole exposing the second conductive portion, the channel portion of the U-shaped portion comprises a first channel portion on a sidewall of the groove close to the first conductive portion, and a second channel portion on a sidewall of the groove close to the second conductive portion.

According to some exemplary embodiments of the present disclosure, the groove has a shape selected from a group comprising a truncated pyramid, a truncated cone, and a column, a sectional shape of the groove in a direction parallel to the substrate is selected from a group comprising a square, a rectangle, a circle and an ellipse, and a sectional shape of the groove in a direction perpendicular to the substrate is selected from a group comprising a trapezoid and a rectangle.

According to some exemplary embodiments of the present disclosure, the U-shaped portion covers all surfaces of the groove, and the U-shaped portion has an annular three-dimensional structure.

According to some exemplary embodiments of the present disclosure, the first insulating layer has a protrusion exposing at least a portion of the first electrode, the active layer comprises an inverted U-shaped portion on the protrusion and a connection portion on the first electrode, and the inverted U-shaped portion comprises a conductive portion on a top of the protrusion and a channel portion on a sidewall of the protrusion.

According to some exemplary embodiments of the present disclosure, the above thin film transistor further comprises: a second insulating layer covering the active layer; a control electrode on the second insulating layer, a position of the control electrode corresponding to a position of the channel portion; a third insulating layer covering the control electrode, the third insulating layer having a via hole exposing the conductive portion. The second electrode is located on the third insulating layer and is connected to the conductive portion through the via hole.

According to some exemplary embodiments of the present disclosure, the channel portion comprises a first channel portion and a second channel portion on two sides of the protrusion.

According to some exemplary embodiments of the present disclosure, the protrusion has a shape selected from a group comprising a truncated pyramid, a truncated cone, and a column, a sectional shape of the protrusion in a direction parallel to the substrate is selected from a group comprising a square, a rectangle, a circle and an ellipse, and a sectional shape of the protrusion in a direction perpendicular to the substrate is selected from a group comprising a trapezoid and a rectangle.

According to some exemplary embodiments of the present disclosure, the inverted U-shaped portion covers all surfaces of the protrusion, and the inverted U-shaped portion has an annular three-dimensional structure.

Another aspect of the present disclosure provides an array substrate comprising any of the thin film transistors described above.

According to some exemplary embodiments of the present disclosure, one of the first electrode and the second electrode is integral with a pixel electrode of the array substrate, and the other of the first electrode and the second electrode is formed of a same material in a same layer as a data line of the array substrate.

According to some exemplary embodiments of the present disclosure, the thin film transistor further comprises a control electrode on the active layer, the control electrode being formed of a same material in a same layer as a gate line of the array substrate.

A further aspect of the present disclosure provides a display device comprising any of the array substrates described above.

Yet another aspect of the present disclosure provides a method of manufacturing a thin film transistor, comprising: forming a first electrode on a substrate; forming a first insulating layer on the first electrode, the first insulating layer having a sidewall; forming an active layer on the first insulating layer, the active layer being connected to the first electrode and comprising a portion located on the sidewall which is configured as a channel of the thin film transistor; and forming a second electrode on the active layer, the second electrode being connected to the active layer.

According to some exemplary embodiments of the present disclosure, forming the first insulating layer comprises: forming a first insulating film on the first electrode; and patterning the first insulating film to form a groove exposing at least a portion of the first electrode. Forming the active layer comprises: forming a U-shaped portion within the groove; and forming a conductive portion outside the groove. The U-shaped portion comprises a connection portion at a bottom of the groove and connected to the first electrode and a channel portion on a sidewall of the groove.

According to some exemplary embodiments of the present disclosure, forming the first insulating layer comprises: forming a first insulating film on the first electrode; and patterning the first insulating film to form a protrusion exposing at least a portion of the first electrode. Forming the active layer comprises: forming an inverted U-shaped portion on the protrusion; and forming a connection portion on the first electrode. The inverted U-shaped portion comprises a conductive portion on a top of the protrusion and a channel portion on a sidewall of the protrusion.

According to some exemplary embodiments of the present disclosure, one of the first electrode and the second electrode is made of an opaque metal material, and the other of the first electrode and the second electrode is made of a transparent conductive material.

Of course, implementation of any product or method of the present disclosure does not necessarily require all of the advantages described above to be achieved at the same time. Other features and advantages of the present disclosure will be set forth in subsequent embodiments of the specification, and part of them will become apparent from the embodiments of the specification or be understood by implementing the present invention. The purposes and other advantages of the embodiments of the present disclosure can be realized and obtained by the structures particularly indicated in the specification, claims and drawings.

BRIEF DESCRIPTION OF THE DRAWINGS

The drawings are intended to provide a further understanding of the technical solutions of the present disclosure, which constitute a part of the specification to illustrate the technical solutions of the present disclosure together with embodiments thereof, rather than limiting the technical solutions. The shapes and sizes of various components in the drawings do not reflect true proportions, and are merely intended to illustrate the present disclosure.

DETAILED DESCRIPTION

Implementations of the present disclosure will be further described in detail below with reference to the accompanying drawings and embodiments. The following embodiments are intended to illustrate the present disclosure, but are not intended to limit the scope of the present disclosure. It is to be noted that embodiments in the present application and features in the embodiments may be arbitrarily combined with each other in the case of causing no conflict.

Figure 1:
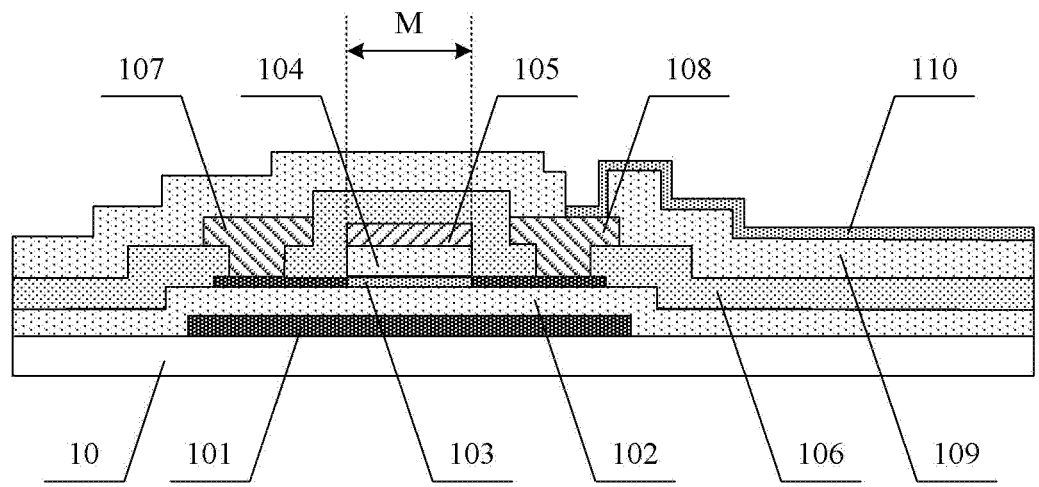
FIG. 1 is a schematic structural view of a typical top gate type thin film transistor.

FIG. 1 is a schematic structural view of a typical thin film transistor. As shown in FIG. 1, the thin film transistor comprises an active layer 103 on a substrate 10, a second insulating layer 104 and a gate electrode 105 on the active layer 103, a third insulating layer 106 covering the active layer 103 and the gate electrode 105, a source electrode 107 and a drain electrode 108 on the third insulating layer 106, the source electrode 107 and the drain electrode 108 being connected to the active layer 103 through two first via holes provided in the third insulating layer 106, a fourth insulating layer 109 covering the source electrode 107 and the drain electrode 108, and a pixel electrode 110 on the fourth insulating layer 109, the pixel electrode 110 being connected to the drain electrode 108 through a second via provided in the fourth insulating layer 109.

In case the thin film transistor is applied in an array substrate, as shown in FIG. 1, the array substrate may further comprise a light shielding layer 101 between the substrate 10 and the active layer 103, and a first insulating layer 102 covering the light shielding layer 101.

Correspondingly, the manufacturing process of the array substrate as shown in FIG. 1 comprises: forming a pattern of the light shielding layer 101 by a first patterning process; forming patterns of the first insulating layer 102 and the active layer 103 by a second patterning process; forming patterns of the second insulating layer 104 and the gate electrode 105 by a third patterning process, and performing conductive treatment on two sides of the active layer 103 by means of shielding of the patterns of the gate electrode 105 and the second insulating layer 104; forming a pattern of the third insulating layer 106 provided with two first via holes by a fourth patterning process; forming patterns of the source electrode 107 and the drain electrode 108 by a fifth patterning process, the source electrode 107 and the drain electrode 108 being connected to the active layer 103 through the first via holes, respectively; forming a pattern of the fourth insulating layer 109 provided with a second via hole by a sixth patterning process; and forming a pattern of the pixel electrode 110 by a seventh patterning process, the pixel electrode 110 being connected to the drain electrode 108 through the second via hole.

In the thin film transistor shown in FIG. 1, the channel length thereof is approximately equal to the length M of the gate electrode 104. Since the margin in the existing manufacturing process of an array substrate is already small, the critical dimension CD of the length M of the gate electrode can only be minimized to 4 µm due to the limitation of the exposure precision of an exposure machine, thus the channel length of the structure can only be minimized to 4 µm. Moreover, under the current technological limits, further reduction in the length of the gate electrode will not ensure the yield. Therefore, how to reduce the channel length has become a bottleneck of display technologies with high frequency, high resolution, high aperture ratio and low power consumption.

In view of this, an embodiment of the present disclosure provides a thin film transistor comprising a first electrode, a first insulating layer, an active layer, and a second electrode successively disposed on a substrate, wherein the active layer is connected to the first electrode and the second electrode, respectively, the first insulating layer is provided with a sidewall, and a portion of the active layer located on the sidewall is configured as a channel of the thin film transistor.

The technical solutions of embodiments of the present disclosure will be described in detail below through specific embodiments.

Figure 2:
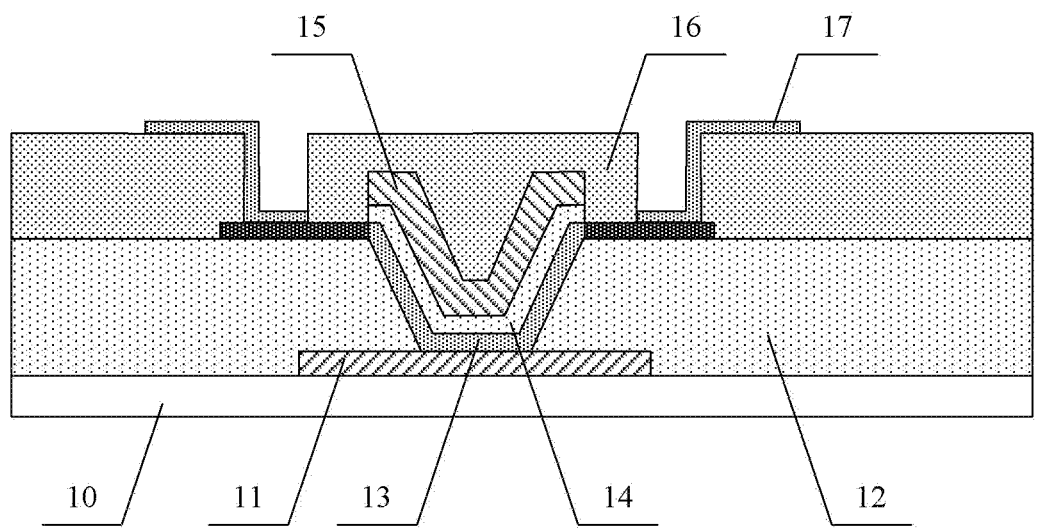
FIG. 2 is a schematic structural view of a thin film transistor according to an embodiment of the present disclosure.

FIG. 2 is a schematic structural view of a thin film transistor according to an embodiment of the present disclosure. As shown in FIG. 2, the thin film transistor comprises a first electrode 11 on a substrate 10; a first insulating layer 12 covering the first electrode 11, the first insulating layer 12 having a groove located therein and exposing at least a portion of the first electrode 11; an active layer 13 comprising a conductive portion on the first insulating layer 12 and a U-shaped portion located within the groove, the U-shaped portion comprising a connection portion located at the bottom of the groove and connected to the first electrode 11 and a channel portion located on a sidewall of the groove; a second insulating layer 14 covering the U-shaped portion of the active layer 13; a control electrode 15 on the second insulating layer 14; a third insulating layer 16 covering the conductive portion of the active layer 13 and the control electrode 15, the third insulating layer 16 having a via hole exposing the conductive portion of the active layer 13; and a second electrode 17 on the third insulating layer 16, the second electrode 17 being connected to the conductive portion of the active layer 13 through the via hole.

In the above embodiment, the first electrode 11 is one of a source electrode and a drain electrode of the thin film transistor, and the second electrode 12 is the other of the source electrode and the drain electrode of the thin film transistor. The control electrode 15 is a gate electrode of the thin film transistor.

As used herein, the term "conductive portion" refers to a conductor portion formed by subjecting an oxide semiconductor material to conductive treatment.

In the above-described embodiment of the present disclosure, a groove is provided within the first insulating layer, and the channel of the thin film transistor is formed on the sidewall of the groove. In this way, compared to the existing structure limited by the technological limits, the thin film transistor provided by the embodiment of the present disclosure breaks through the limits of the prior art, effectively reduces the channel length, and may even reduce the channel length by an order of magnitude, which in turn minimizes the channel resistance, increases the on-state current, and reduces the power consumption, thereby greatly improving the product performance. In the case of a fixed channel width, the reduction in the channel length enables the thin film transistor to have a larger width to length ratio, thereby increasing the response speed when the channel is turned on. Moreover, this embodiment makes the formed thin film transistor occupy a small area by setting the first electrode, the first insulating layer, the active layer, the control electrode, and the second electrode to be a laminated structure perpendicular to the substrate.

In an exemplary embodiment, the orthographic projections of the second insulating layer 14 and the control electrode 15 on the substrate 10 coincide with each other. Alternatively, in an exemplary embodiment, the orthographic projection of the control electrode 15 on the substrate 10 is within that of the second insulating layer 14 on the substrate 10.

In an exemplary embodiment, the orthographic projection of the second insulating layer 14 on the substrate 10 coincides with that of the U-shaped portion of the active layer 13 on the substrate 10.

By way of example, as shown in FIG. 2, the conductive portion of the active layer 13 comprises a first conductive portion and a second conductive portion located on two sides of the groove. Accordingly, the via hole in the third insulating layer 16 includes a via hole exposing the first conductive portion and a via hole exposing the second conductive portion. The channel portion of the U-shaped portion includes a first channel portion located on a sidewall of the groove close to the first conductive portion, and a second channel portion located on a sidewall of the groove close to the second conductive portion. The first channel portion and the second channel portion form a double channel structure connected in parallel between the first electrode 11 and the second electrode 17.

The technical solution of this embodiment will be further set forth below by describing the manufacturing process of the thin film transistor shown in FIG. 2. As used herein, the term "patterning process" involves processes commonly used in the art, such as film deposition, photoresist coating, mask exposure, development, etching, photoresist stripping, and the like. Deposition may include known processes such as sputtering, evaporation, chemical vapor deposition, and the like, which is not specifically limited herein.

Figure 3A:
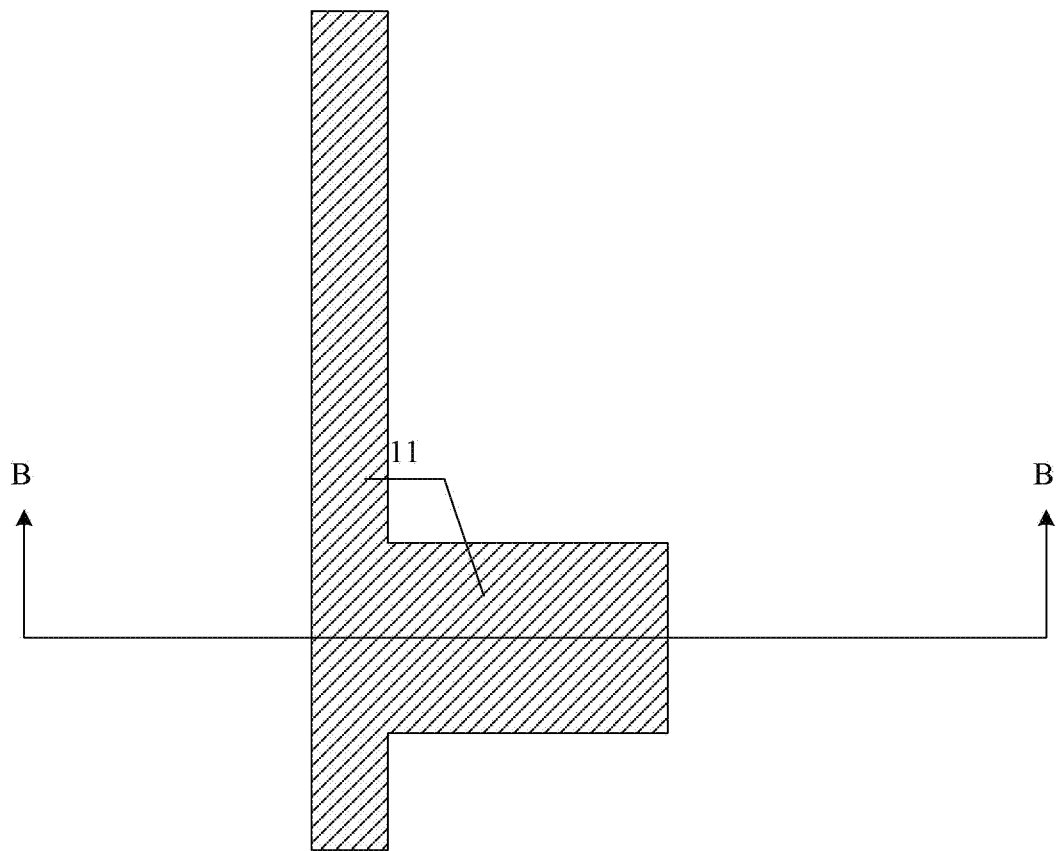
FIGS. 3a and 3b are a top view and a sectional view after forming a first electrode pattern during the process of manufacturing the thin film transistor shown in FIG. 2, respectively.
Figure 3B:

Firstly, a pattern of the first electrode 11 is formed on the substrate 10, as shown in FIGS. 3a and 3b, wherein FIG. 3a is a top view, and FIG. 3b is a sectional view taken along line B-B in FIG. 3a. Specifically, forming a pattern of the first electrode may comprise: depositing a first metal film on the substrate, coating a photoresist on the first metal film, performing exposure and development of the photoresist using a single-tone mask, so as to retain the photoresist at a position where the first electrode is to be formed, and remove the photoresist at other positions to expose the first metal film; and etching the exposed first metal film and stripping off the remaining photoresist to form the pattern of the first electrode. By way of example, the substrate may employ a glass, plastic or flexible transparent substrate. The first metal film may employ a metal material such as aluminum, copper, molybdenum, titanium, niobium, silver, gold, tantalum, tungsten, chromium, or the like, which may be a single layer structure or a multilayer composite structure.

Figure 4A:
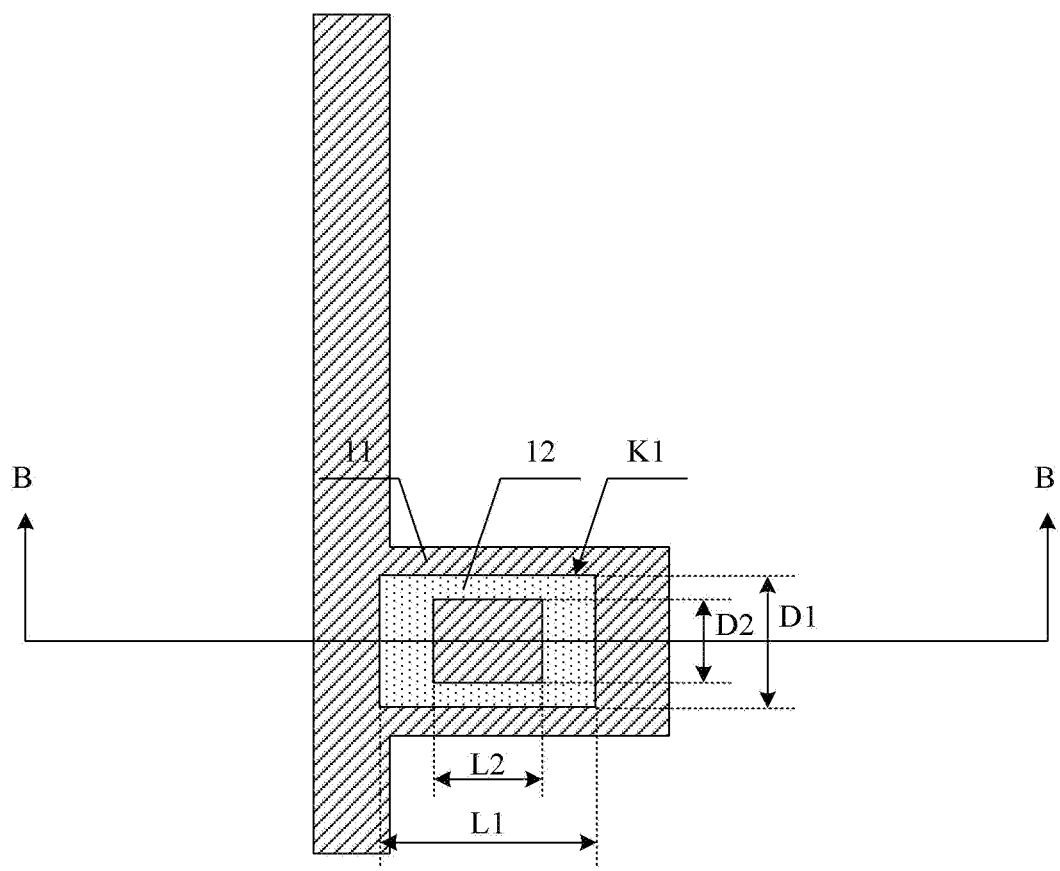
FIGS. 4a and 4b are a top view and a sectional view after forming a first insulating layer pattern during the process of manufacturing the thin film transistor shown in FIG. 2, respectively.
Figure 4B:
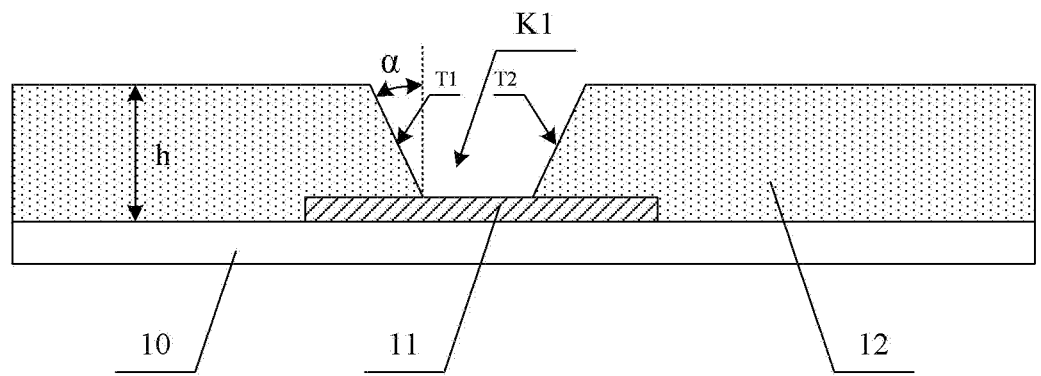

Next, a pattern of the first insulating layer 12 having a groove K1 is formed on the first electrode 11, as shown in FIGS. 4a and 4b, wherein FIG. 4a is a top view, and FIG. 4b is a sectional view taken along line B-B in FIG. 4a. Specifically, forming a pattern of the first insulating layer having a groove may comprise: depositing a first insulating film on the substrate on which the pattern of the first electrode is formed, coating a photoresist on the first insulating film, performing exposure and development of the photoresist using a single-tone mask so as to remove the photoresist at a position where the groove is to be formed to expose the first insulating film, while retaining the photoresist at other positions; etching the exposed first insulating film and stripping off the remaining photoresist to form a pattern of the first insulating layer having a groove. In particular, the orthographic projection of the groove K1 on the substrate 10 is located within the orthographic projection of the first electrode 11 on the substrate 10 so that the groove K1 exposes at least part of the surface of the first electrode 11.

In an exemplary embodiment, the first insulating layer 12 has a thickness h ranging from 0.4 μm to 4 μm. In order to ensure the operating stability of the thin film transistor, the first insulating layer 12 may be made of a material such as silicon nitride SiNx, silicon oxide SiOx, silicon oxynitride SiOxNx, aluminum oxide $Al_2O_3$ or the like, may be a single layer or a composite film of SiNx/SiOx, SiNx/SiOxNx, SiOxNx/SiOx or SiNx/SiOx/SiOxNx, and can be fabricated by physical vapor deposition (PVD). Alternatively, the first insulating layer 12 may also be made of an organosilicon material having a small amount of hydrogen, and in this case, it is fabricated by coating.

In an exemplary embodiment, the groove K1 is in the shape of a truncated pyramid. The sectional shape of the groove K1 in a direction parallel to the substrate 10 is a square or a rectangle. The top of the groove has a length L1 and a width D1, and the bottom of the groove has a length L2 and a width D2, L1≥D1, L2≥D2. In the direction perpendicular to the substrate 10, the sectional shape of the groove K1 is a trapezoid.

As used herein, the term "length" refers to a dimension perpendicular to the direction of the data line of the array substrate, and the term "width" refers to a dimension parallel to the direction of the data line of the array substrate. In this case, by way of example, it can be set that L1=5 m~12 μm, D1=5 μm~12 μm, L2=4 μm~10 μm, and D2=4 μm~10 μm. In this way, in the length direction of the groove, the groove K1 is formed with two sidewalls: a first sidewall T1 and a second sidewall T2. The angle α formed by each of the first sidewall T1 and the second sidewall T2 with respect to the normal direction of the substrate 10 is arctg((L1−L2)/2 h), and the length of each of the first sidewall T1 and the second sidewall T2 is h/cos α.

Alternatively, the groove K1 may also be in the shape of a truncated cone instead of the shape of a truncated pyramid as shown in FIG. 4b, that is, the sectional shape of the groove K1 in a direction parallel to the substrate 10 is a circle, an ellipse or other regular shapes. This can be controlled by adjusting the shape of the light transmitting region in the mask. Alternatively, the groove K1 may also be columnar, that is, the sectional shape of the groove K1 in a direction perpendicular to the substrate 10 is a rectangle, in which case L1=L2, D1=D2, the angle α formed by each of the first sidewall T1 and the second sidewall T2 with respect to the normal direction of the substrate 10 is 0, and the length of each of the first sidewall T1 and the second sidewall T2 is the thickness h of the first insulating layer 12. Since the length L1 and the width D1 of the top of the groove can be controlled by adjusting the light transmitting region in the mask, and the length L2 and the width D2 of the bottom of the groove can be controlled by the etching rate, the angle α formed by each of the first sidewall T1 and the second sidewall T2 with respect to the normal direction of the substrate 10 can be controlled during fabrication, which may be controlled in the range of 0≤α≤60°, that is, the lengths of the first sidewall T1 and the second sidewall T2 are h to 2 h. By way of example, α is 20≤α≤45°, and the lengths of the first sidewall T1 and the second sidewall T2 are 1.06 h to 1.4 h.

Figure 5A:
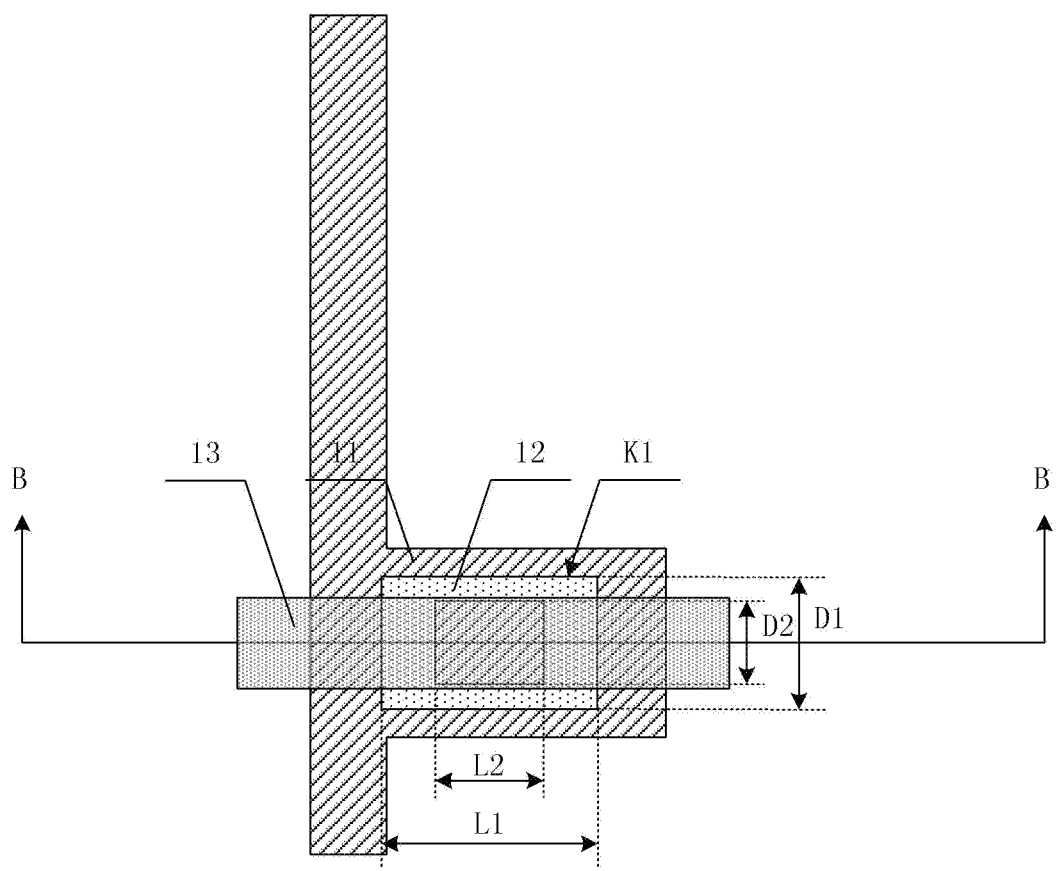
FIGS. 5a and 5b are a top view and a sectional view after forming an oxide active layer pattern during the process of manufacturing the thin film transistor shown in FIG. 2, respectively.
Figure 5B:
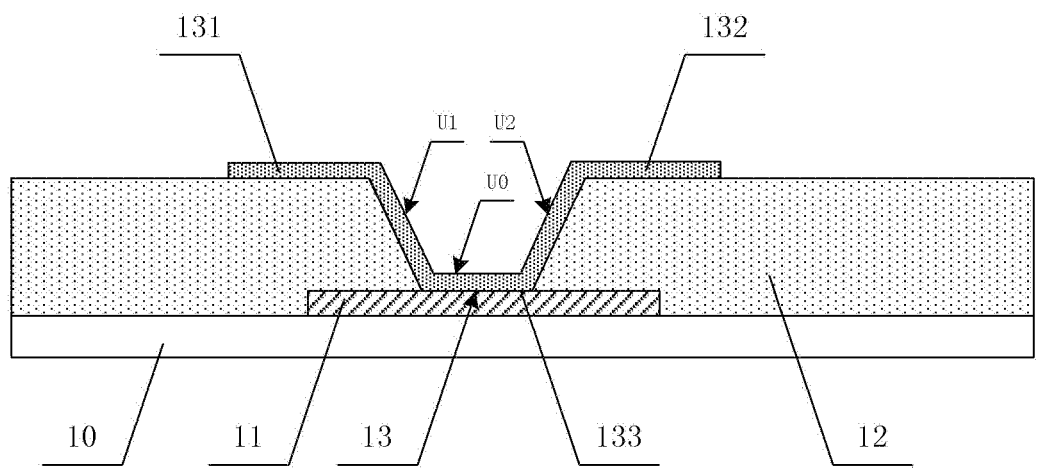

Next, a pattern of the active layer 13 is formed on the first insulating layer 12, as shown in FIGS. 5a and 5b, wherein FIG. 5a is a top view, and FIG. 5b is a sectional view taken along line B-B in FIG. 5a. Specifically, forming a pattern of the active layer may comprise: depositing a semiconductor film on the substrate on which the first insulating layer is formed, and patterning the semiconductor film by a patterning process, thereby forming a pattern of the active layer. The active layer 13 comprises a first external extension portion 131, a second external extension portion 132, and a U-shaped portion 133. The material of the semiconductor film may be IGZO (Indium Gallium Zinc Oxide), ITZO (Indium Tin Zinc Oxide) or other metal oxides having semiconductor properties.

By way of example, the active layer 13 is in the shape of a strip, which has a length greater than the length L1 of the top of the groove in the length direction of the groove K1, so that the two sidewalls of the groove K1 in this direction are covered, and has a width greater than the width D2 of the bottom of the groove but smaller than the width D1 of the top of the groove in the width direction of the groove K1, so that the two sidewalls of the groove K1 in this direction are partially covered. Therefore, the active layer 13 has a shape that its middle part is located within the groove K1 and its two sides are located on the first insulating layer 12. The portion of the active layer 13 formed within the groove K1 is referred to as a U-shaped portion 133, the portion of the active layer 13 formed on the first insulating layer 12 on a side of the groove K1 is referred to as a first external extension portion 131 which is connected to an end of the U-shaped portion 133, and the portion of the active layer 13 formed on the first insulating layer 12 on an opposing side of the groove K1 is referred to as a second external extension portion 132 which is connected to an opposing end of the U-shaped portion 133.

The U-shaped portion 133 includes a connection portion U0 located at the bottom of the groove K1 and connected to the first electrode 11, a first channel portion U1 formed on the first sidewall T1 in the groove K1, and a second channel portion U2 formed on the second sidewall T2 in the groove K1. The lower end of the first channel portion U1 is connected to an end of the connection portion U0, the lower end of the second channel portion U2 is connected to an opposing end of the connection portion U0, the upper end of the first channel portion U1 is connected to the first external extension portion 131, and the upper end of the second channel portion U2 is connected to the second external extension portion 132. In this way, in the formed active layer 13, the connection portion U0 of the U-shaped portion 133 realizes connection to the first electrode 11, the first external extension portion 131 and the second external extension portion 132 are used to realize connection to the second electrode to be formed subsequently, and the first channel portion U1 and the second channel portion U2 as channels form a double channel structure connected in parallel between the first electrode and the second electrode. Since the first channel portion U1 and the second channel portion U2 are formed on the first sidewall T1 and the second sidewall T2 in the groove K1 respectively, the length of the first channel portion U1 and the second channel portion U2 is approximately equal to the length of the first sidewall T1 and the second sidewall T2, that is, the length L of the first channel portion U1 is equal to h to 2 h, and the length L of the second channel portion U2 is equal to h to 2 h. By way of example, the first channel portion U1 and the second channel portion U2 have a length L=1.06 h~1.4 h. Since the first channel portion U1 and the second channel portion U2 are of a parallel structure so that the overall channel resistance is half of the resistance of a single channel portion, the equivalent length of the channel having the parallel structure in this embodiment is L/2, which is much smaller than the critical size CD of the existing manufacturing process.

By way of example, when the thickness h of the first insulating layer is 0.4 μm to 4 μm, the equivalent length of the channel is 0.2 μm to 2 μm. Compared to the prior art structure in which the channel length is approximately equal to 4 μm, this embodiment breaks through the limits of the prior art, greatly reduces the channel length, and may even reduce the channel length by an order of magnitude.

Figure 6A:
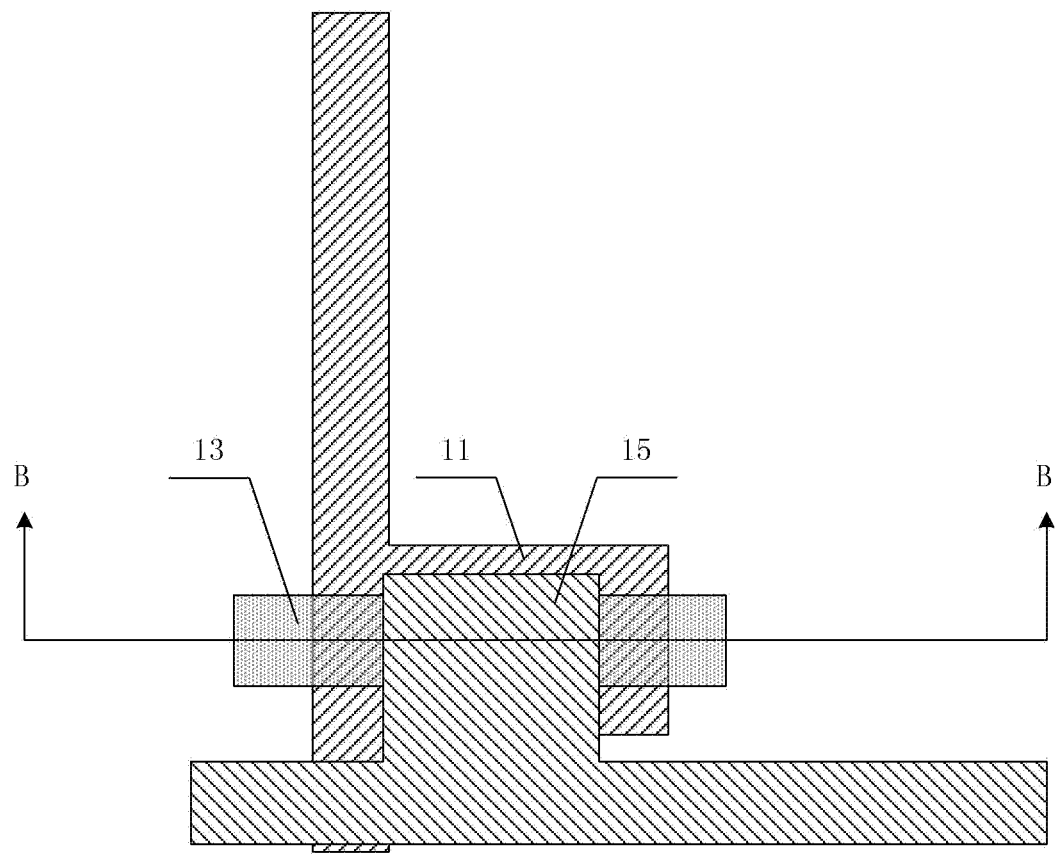
FIGS. 6a and 6b are a top view and a sectional view after forming a gate electrode pattern during the process of manufacturing the thin film transistor shown in FIG. 2, respectively.
Figure 6B:
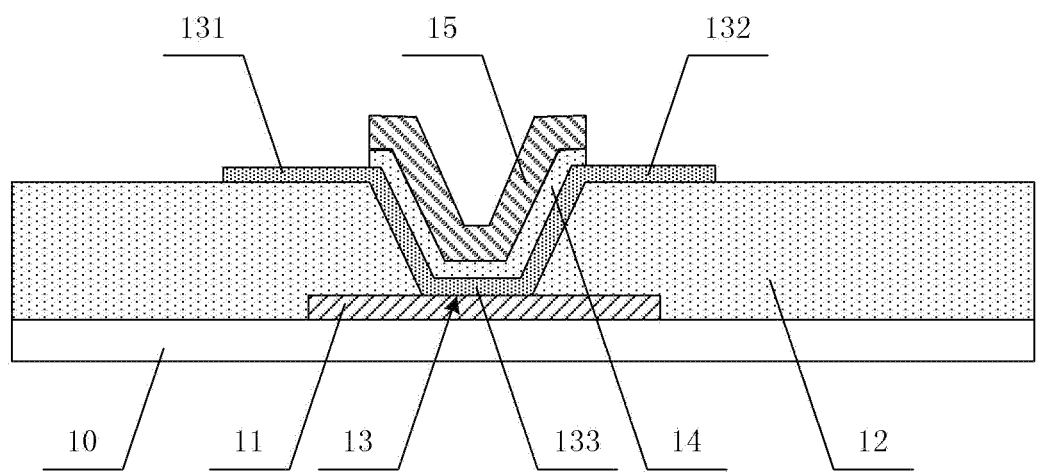

Next, patterns of the second insulating layer 14 and the control electrode 15 are formed on the active layer 13, as shown in FIGS. 6a and 6b, wherein FIG. 6a is a top view, and FIG. 6b is a sectional view taken along line B-B in FIG. 6a. Specifically, forming patterns of the second insulating layer and the control electrode comprises: depositing a second insulating film and a second metal film sequentially on the substrate on which the active layer is formed, and patterning the second insulating film and the second metal film by a patterning process, thereby forming a pattern of the second insulating layer 14 on the U-shaped portion 133 of the active layer 13 and a pattern of the control electrode 15 on the second insulating layer 14. By way of example, the second insulating film may be made of silicon nitride SiNx, silicon oxide SiOx, silicon oxynitride SiOxNx or aluminum oxide AlO₃, and may be a single layer or a composite film of SiNx/SiOx, SiNx/SiOxNx, SiOxNx/SiOx or SiNx/SiOx/SiOxNx. The second metal film may be made of a metal material such as aluminum, copper, molybdenum, titanium, niobium, silver, gold, tantalum, tungsten, chromium or the like, and may be a single layer structure or a multilayer composite structure.

In an exemplary embodiment, the second insulating layer 14 and the control electrode 15 may be formed simultaneously using the same mask so that the orthographic projections of the second insulating layer 14 and the control electrode 15 on the substrate 10 coincide with each other. Alternatively, the second insulating layer 14 and the control electrode 15 may be formed separately using different masks so that the orthographic projection of the control electrode 15 on the substrate 10 is within the orthographic projection of the second insulating layer 14 on the substrate 10. In this embodiment, the control electrode 15 is formed within the groove K1, and partial regions of the control electrode 15 correspond to the first channel portion U1 and the second channel portion U2 of the active layer 13. The formed second insulating layer 14 covers the U-shaped portion 133 of the active layer 13 while exposing the first external extension portion 131 and the second external extension portion 132 of the active layer 13. By way of example, the orthographic projection of the second insulating layer 14 on the substrate 10 is located within the orthographic projection of the groove K1 on the substrate 10, and the length of the orthographic projection of the second insulating layer 14 on the substrate 10 is less than the length L1 of the top of the groove so that the channel is distributed along the sidewall formed on the first insulating layer.

Figure 7:
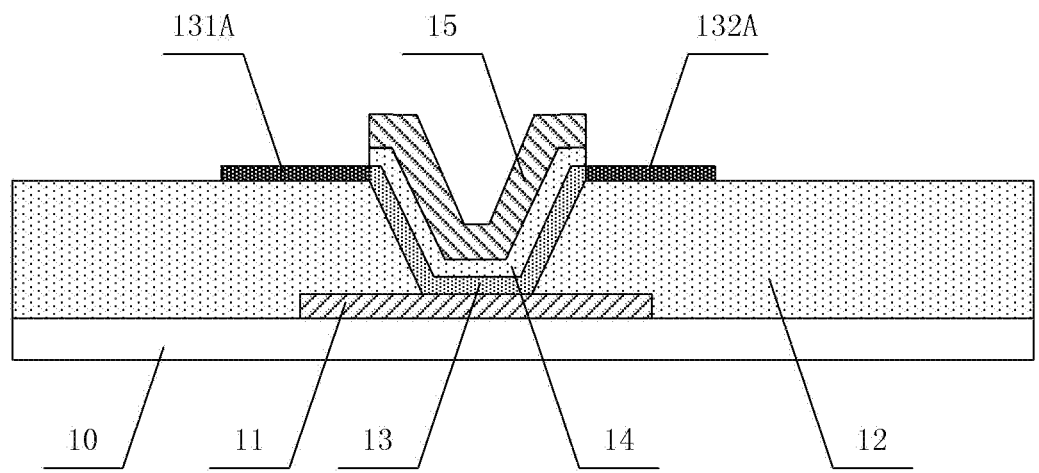
FIG. 7 is a sectional view after the conductive treatment during the process of manufacturing the thin film transistor shown in FIG. 2.

Subsequently, the first external extension portion 131 and the second external extension portion 132 that are exposed are subjected to conductive treatment so that the first external extension portion 131 and the second external extension portion 132 become conductive to form a first conductive portion 131A and a second conductive portion 132A respectively, as shown in FIG. 7. Since the U-shaped portion 133 is covered by the second insulating layer 14 and the control electrode 15, the U-shaped portion 133 of the active layer 13 does not become conductive. The conductive treatment may employ a plasma treatment method such as Ar, $H_2$, $CF_4$ or the like, or a laser surface irradiation treatment method.

Figure 8:
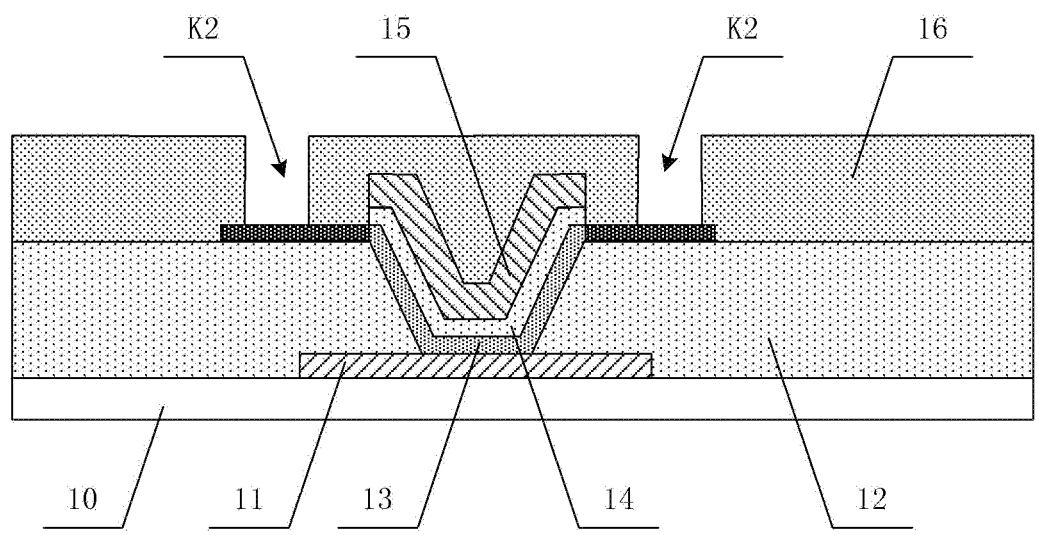
FIG. 8 is a sectional view after forming a third insulating layer pattern during the process of manufacturing the thin film transistor shown in FIG. 2.

Then, a pattern of the third insulating layer 16 having via holes is formed on the control electrode 15, as shown in FIG. 8. Specifically, forming a pattern of the third insulating layer having via holes comprises: depositing a third insulating film on the substrate 10 on which the control electrode 15 is formed, patterning the third insulating film by a patterning process, thereby forming a pattern of the third insulating layer 16 having two via holes K2. The two via holes K2 are located above the first conductive portion 131A and the second conductive portion 132A of the active layer 13, respectively, thereby exposing at least part of the surfaces of the first conductive portion 131A and the second conductive portion 132A, respectively. The third insulating film may be made of silicon nitride SiNx, silicon oxide SiOx, silicon oxynitride SiOxNx or aluminum oxide $AlO_3$, and may be a single layer, or a composite film of SiNx/SiOx, SiNx/SiOxNx, SiOxNx/SiOx or SiNx/SiOx/SiOxNx.

Next, a pattern of the second electrode 17 is formed on the third insulating layer 16, as shown in FIG. 2. Specifically, forming a pattern of the second electrode comprises: depositing a transparent conductive film on the substrate 10 on which the third insulating layer 16 is formed, and patterning the transparent conductive film by a patterning process, thereby forming a pattern of the second electrode 17 on the third insulating layer 16. The second electrode 17 is connected to the first conductive portion 131A and the second conductive portion 132A of the active layer 13 through the via holes K2, respectively. The transparent conductive film may employ indium tin oxide ITO or indium zinc oxide IZO.

In case the thin film transistor shown in FIG. 2 is used in an array substrate, the second electrode 17 may be formed integrally with a pixel electrode of the array substrate. That is, a portion of the second electrode 17 is connected to the active layer 13 and functions as a drain electrode of the thin film transistor, and another portion of the second electrode 17 is connected the drain electrode of the thin film transistor and functions as the pixel electrode of the array substrate. In this way, it is not necessary to connect the active layer and the pixel electrode separately using a metal material as in the prior art structure, so that the structure of the array substrate is simple, and the electrical connection relationships are simple, effective and reliable, thereby improving the electrical stability and the operating reliability of the thin film transistor and the array substrate.

In an exemplary embodiment, the first electrode 11 may be disposed in the same layer and formed by the same patterning process as the data line of the array substrate, and the first electrode 11 is connected to a data line. Further, the first electrode 11 formed of a metal material can also function as a light shielding layer to thereby prevent light from irradiating the active layer 13, thus ensuring stable properties of the thin film transistor.

In an exemplary embodiment, the control electrode 15 may be disposed in the same layer and formed by the same patterning process as the gate line of the array substrate, and the control electrode 15 is connected to a gate line.

In such an embodiment, compared to the existing manufacturing method that requires seven patterning processes, the source electrode is also used as a light shielding layer and the pixel electrode is directly connected to the active layer, so that the above-described array substrate can be manufactured only by six patterning processes, which thus reduces the number of patterning processes, increases the production efficiency, and reduces the production cost. In addition, during the manufacturing process of the array substrate in this embodiment, there is no need to add new equipment or special processing technology, achieving good process compatibility, strong practicability and possessing a good application prospect.

It is to be noted that the above-described embodiment is applicable to various types of thin film transistors such as an oxide thin film transistor, an amorphous silicon thin film transistor, a polysilicon thin film transistor, and the like.

In another embodiment according to the present disclosure, a thin film transistor comprises: a first electrode on a substrate; a first insulating layer covering the first electrode, which has a groove exposing the first electrode; an active layer comprising a conductive portion on the first insulating layer and a U-shaped portion within the groove, wherein the U-shaped portion includes a connection portion located at the bottom of the groove and connected to the first electrode and a channel portion on the sidewalls of the groove; a second insulating layer covering the U-shaped portion of the active layer; a control electrode on the second insulating layer; a third insulating layer covering the conductive portion of the active layer and the control electrode, which has a via hole exposing the conductive portion of the active layer; a second electrode on the third insulating layer, the second electrode being connected to the conductive portion of the active layer through the via hole.

Different from the embodiment shown in FIG. 2, unlike the strip-shaped active layer 13 shown in FIG. 5a, in this embodiment, the section of the U-shaped portion of the active layer in a direction parallel to the substrate has a circular shape, so that the conductive portion of the U-shaped portion is of an annular structure in the direction, and the channel portion of the U-shaped portion has an annular three-dimensional structure.

In this embodiment, the conductive portion of the active layer is an integral structure located outside the groove, and the via hole in the third insulating layer includes at least one via hole exposing the conductive portion. The channel portion is located on all of the sidewalls of the groove to form an annular three-dimensional conductive channel connected between the first electrode and the second electrode.

Accordingly, unlike the manufacturing process of the thin film transistor shown in FIG. 2, at the time of manufacturing the thin film transistor of this embodiment, the formed active layer covers all of the sidewalls of the groove. Specifically, the active layer comprises an annular channel portion located within the groove and a conductive portion located outside the groove. The annular channel portion includes a connection portion located at the bottom of the groove and connected to the first electrode, and a channel portion located on all of the sidewalls of the groove, the channel portion forming an annular three-dimensional conductive channel within the groove. The annular three-dimensional conductive channel is connected to the first electrode through the connection portion at the bottom of the groove, and is connected to the second electrode through the conductive portion outside the groove.

In this embodiment, since the annular three-dimensional conductive channel is of an integral structure instead of a double channel parallel structure, the length of the conductive channel is the length L of the channel portion. Different from the two conductive portions being independent from each other as shown in FIG. 2, the conductive portion in this embodiment has an integral structure. Therefore, when forming the via hole in the third insulating layer, it is possible to form only one via hole to realize connection between the second electrode and the active layer. Optionally, it is also possible to form a plurality of via holes exposing the conductive portion in the third insulating layer to improve the reliability of the connection.

In this embodiment, the thin film transistor not only has advantages such as greatly reducing the channel length, increasing the aperture ratio, being simple in structure and electrical connection relationships, reducing the number of patterning processes, having good process compatibility, and like, but also can realize a significant increase in the channel width to length ratio.

The channel width to length ratio is an important parameter of a thin film transistor, the magnitude of which directly affects the functional characteristics of the thin film transistor. A small channel width to length ratio not only results in a low on-state current (Ion), but also reduces the response speed when the channel is turned on. As the display performance is improved, the channel of the thin film transistor is required to have a larger width to length ratio. In general, the channel width to length ratio can be increased by increasing the channel width or reducing the channel length. Since reducing the channel length involves great difficulty and needs to break through the technological limits of the existing manufacturing method, typically, the channel width to length ratio is increased mainly by increasing the channel width. At present, a conventional method for increasing the channel width is to increase the areas of the source electrode and the drain electrode, but increasing the areas of the source electrode and the drain electrode will cause them to occupy a larger area of the pixel region of the array substrate, thereby resulting in a decrease in the aperture ratio. In addition, when the area of the source electrode is large, the capacitance between the source electrode and the active layer becomes large, so that a color shift will occur in displayed images in the case where the voltage of the pixel electrode jumps. Therefore, being limited by the aperture ratio and the display performance, it is difficult to achieve a significant increase in the channel width by conventional means.

In contrast, in the thin film transistor proposed by this embodiment, the generatrix length of the annular channel is the channel length, and the circumferential length of the annular channel is the channel width. Therefore, the channel length and the channel width can be controlled by designing the size of the groove, thereby effectively increasing the channel width without affecting the aperture ratio and the display performance. Therefore, this embodiment can maximize the channel width to length ratio of the thin film transistor and improve the characteristics of the thin film transistor.

In an array substrate using the thin film transistor shown in FIG. 2, the first electrode on the substrate is a metal electrode, and the second electrode on the third insulating layer is a transparent electrode. The first electrode is formed by the same patterning process in the same layer as the data line, and the second electrode also functions as a pixel electrode. Alternatively, in a further embodiment according to the present disclosure, the first electrode on the substrate is a transparent electrode, and the second electrode on the third insulating layer is a metal electrode. Accordingly, in such an embodiment, the first electrode is also used as a pixel electrode, and the second electrode is formed by the same patterning process in the same layer as the data line.

Similarly, in such an embodiment, the thin film transistor also has advantages such as greatly reducing the channel length, increasing the aperture ratio, being simple in structure and electrical connection relationships, reducing the number of patterning processes, having good process compatibility, significantly increasing the channel width to length ratio, and the like, and the second electrode can function as a light shielding layer.

Figure 9:
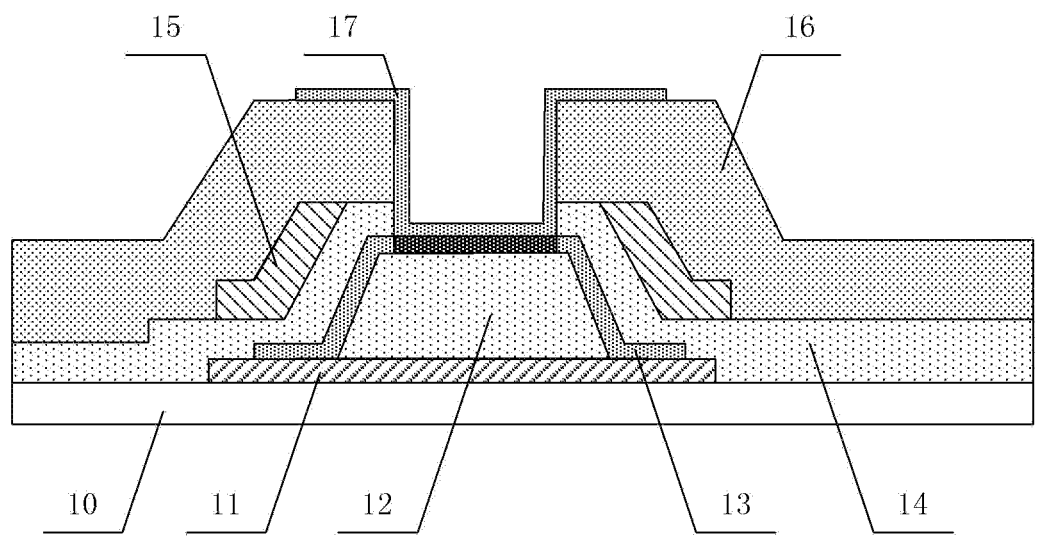
FIG. 9 is a schematic structural view of a thin film transistor according to another embodiment of the present disclosure.

FIG. 9 is a schematic structural view of a thin film transistor according to another embodiment of the present disclosure. As shown in FIG. 9, the thin film transistor comprises a first electrode 11 on a substrate 10; a first insulating layer 12 on the first electrode 11, the first insulating layer 12 comprising a protrusion exposing at least a portion of the first electrode 11, an active layer 13 comprising an inverted U-shaped portion on the protrusion and a connection portion located on the first electrode 11 and connected to the first electrode 11, the inverted U-shaped portion including a conductive portion on the top of the protrusion and a channel portion on the sidewall of the protrusion; a second insulating layer 14 covering the active layer 13; a control electrode 15 on the second insulating layer 14, the position of the control electrode 15 corresponding to the position of the channel portion; a third insulating layer 16 covering the control electrode 15, the third insulating layer 16 having a via hole exposing the conductive portion of the active layer 13; and a second electrode 17 on the third insulating layer 16, the second electrode 17 being connected to the conductive portion of the active layer 13 through the via hole.

In the above-described embodiment, the first electrode 11 is one of the source electrode and the drain electrode of the thin film transistor, and the second electrode 12 is the other of the source electrode and the drain electrode of the thin film transistor. The control electrode 15 is a gate electrode of the thin film transistor.

In the above-described embodiment of the present disclosure, the first insulating layer is configured to have a protrusion, and the channel of the thin film transistor is formed on the sidewall of the protrusion. In this way, compared to the existing structure limited by technological limits, the thin film transistor provided by the embodiment of the present disclosure breaks through the limits of the prior art, effectively reduces the channel length, and may even reduce the channel length by an order of magnitude, which in turn minimizes the channel resistance, increases the on-state current, and reduces the power consumption, thereby greatly improving the product performance. In the case of a fixed channel width, the reduction in the channel length enables the thin film transistor to have a larger width to length ratio, thereby increasing the response speed when the channel is turned on. Moreover, this embodiment makes the formed thin film transistor occupy a small area by setting the first electrode, the first insulating layer, the active layer, the control electrode, and the second electrode to be a laminated structure perpendicular to the substrate.

By way of example, as shown in FIG. 9, the channel portion of the inverted U-shaped portion includes a first channel portion and a second channel portion, which form a double channel structure connected in parallel between the first electrode 11 and the second electrode 17.

The technical solution of this embodiment will be further set forth below by describing the manufacturing process of the thin film transistor shown in FIG. 9.

Figure 10:
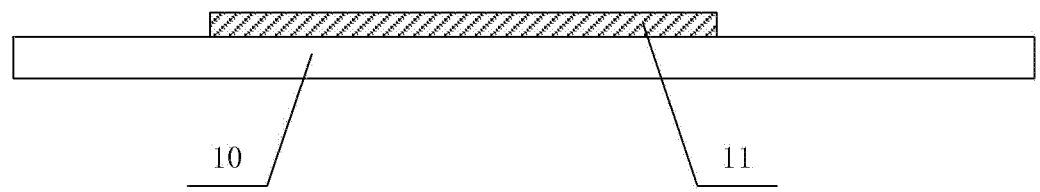
FIG. 10 is a sectional view after forming a first electrode pattern during the process of manufacturing the thin film transistor shown in FIG. 9.

Firstly, a pattern of the first electrode 11 is formed on the substrate 10, as shown in FIG. 10. As in the previous embodiment, the first electrode 11 in this embodiment may employ a metal material such as aluminum, copper, molybdenum, titanium, niobium, silver, gold, tantalum, tungsten, chromium, and the like, and may be a single layer structure or a multilayer composite structure.

Figure 11:
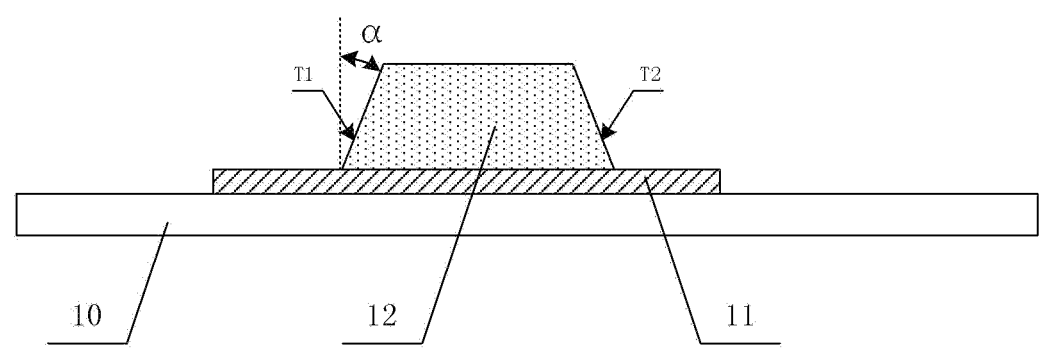
FIG. 11 is a sectional view after forming a first insulating layer pattern during the process of manufacturing the thin film transistor shown in FIG. 9.

Next, a pattern of the first insulating layer 12 is formed on the first electrode 11, as shown in FIG. 11. Specifically, forming a pattern of the first insulating layer may comprise: depositing a first insulating film on the substrate on which the pattern of the first electrode is formed, coating a photoresist on the first insulating film, performing exposure and development of the photoresist using a single-tone mask so as to retain the photoresist at a position where the pattern of the first insulating layer is to be formed, and remove the photoresist at other positions; etching the exposed first insulating film and stripping off the remaining photoresist to thereby form a pattern of the protrusion-like first insulating layer located on the first electrode and exposing a portion of the first electrode. In particular, the first insulating layer may have a thickness h ranging from 0.4 μm to 4 μm.

In an exemplary embodiment, the protrusion is in the shape of a truncated pyramid. The sectional shape of the protrusion in a direction parallel to the substrate 10 is a square or a rectangle. The bottom of the protrusion has a length L1 and a width D1, and the top of the protrusion has a length L2 and a width D2, where L1≥D1, L2≥D2. The sectional shape of the protrusion in a direction perpendicular to the substrate 10 is a trapezoid. In this way, in the length direction of the protrusion, the protrusion in the shape of a truncated pyramid is formed with two sidewalls: a first sidewall T on the left side and a second sidewall T2 on the right side. The angle α formed by each of the first sidewall T1 and the second sidewall with respect to the normal direction of the substrate 10 is $\arctg((L1-L2)/2h)$, and the length of each of the first sidewall and the second sidewall T2 is $h/\cos\alpha$.

Alternatively, the protrusion may also be in the shape of a truncated cone, that is, the sectional shape of the protrusions in a direction parallel to the substrate 10 is a circle, an ellipse or other regular shapes, which can be controlled by adjusting the shape of the light transmitting region in the mask. Alternatively, the protrusion may also be columnar, that is, the sectional shape of the protrusion in a direction perpendicular to the substrate 10 is a rectangle. At that time, L1=L2, D1=D2, the angle α formed by each of the first sidewall T1 and the second sidewall T2 with respect to the normal direction of the substrate 10 is 0, and the length of each of the first sidewall T1 and the second sidewall T2 is the thickness h of the first insulating layer 12. As in the previous embodiment, the first sidewall T1 and the second sidewall T2 in this embodiment are used to form a double channel. By designing the mask and the etching rate, the angle α may be in the range of $0\leq\alpha\leq60°$, that is, the lengths of the first sidewall T1 and the second sidewall T2 are h to 2 h. By way of example, α is the range of $20\leq\alpha\leq45°$, and lengths of the first sidewall T1 and the second sidewall T2 are 1.06 h to 1.4 h.

Figure 12:
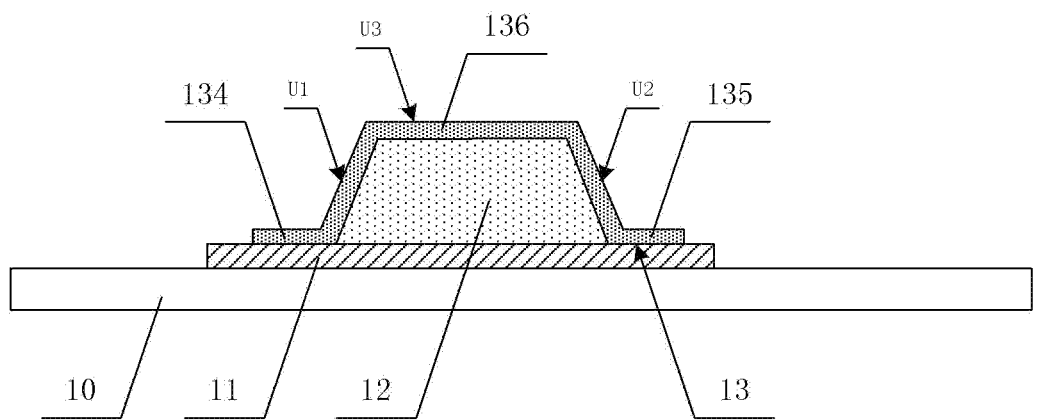
FIG. 12 is a sectional view after forming an oxide active layer pattern during the process of manufacturing the thin film transistor shown in FIG. 9.

Next, a pattern of the active layer 13 is formed on the first insulating layer 12, as shown in FIG. 12. Specifically, forming a pattern of the active layer may comprise: depositing a semiconductor film on the substrate on which the first insulating layer is formed, and patterning the semiconductor film by a patterning process, thereby forming a pattern of the active layer. The active layer 13 includes a first connection portion 134, a second connection portion 135, and an inverted U-shaped portion 136, as shown in FIG. 12.

By way of example, the active layer 13 is in the shape of a strip, which has a length greater than the length of the bottom of the protrusion in the length direction of the protrusion so that the first sidewall T1 and the second sidewall T2 of the protrusion are covered, and has a width greater than the width of the top of the protrusion but less than the width of the bottom of the protrusion in the width direction of the protrusion so that the two sidewalls of the protrusion in this direction are partially covered. The portion of the active layer 13 formed on the protrusion is the inverted U-shaped portion 136, the portion of the active layer 13 formed on the first electrode 11 on a side of the protrusion is the first connection portion 134, and the portion of the active layer 13 formed on the first electrode 11 on an opposing side of the protrusion is the second connection portion 135. The inverted U-shaped portion 136 includes a first channel portion U1 on the first sidewall T1 of the protrusion, a second channel portion U2 on the second sidewall T2 of the protrusion, and an internal extension portion U3 on the top of the protrusion.

Thus, in the formed active layer 13, the first connection portion 134 and the second connection portion 135 are connected to the first electrode 11, the internal extension portion U3 of the inverted U-shaped portion 136 is connected to the second electrode to be formed subsequently, and the first channel portion U1 and the second channel portion U2 as channels form a double channel structure connected in parallel between the first electrode and the second electrode. Since the first channel portion U1 and the second channel portion U2 are formed on the first sidewall T1 and the second sidewall T2, respectively, the lengths of the first channel portion U1 and the second channel portion U2 are approximately equal to the lengths of the first sidewall T1 and the second sidewall T2, that is, the length L of the first channel portion U1 is equal to h to 2 h, and the length L of the second channel portion U2 is equal to h to 2 h. By way of example, the lengths L of the first channel portion U1 and the second channel portion U2 are 1.06 h to 1.4 h. Since the first channel portion U1 and the second channel portion U2 are of a parallel structure so that the overall channel resistance is half of the resistance of a single channel portion, the equivalent length of the channel having the parallel structure in this embodiment is L/2. When the thickness h of the first insulating layer is 0.4 μm to 4 μm, the equivalent length of the channel is 0.2 μm to 2 μm. Compared to the prior art structure in which the channel length is approximately equal to 4 μm, this embodiment breaks through the limits of the prior art, greatly reduces the channel length, and may even reduce the channel length by an order of magnitude.

Figure 13:
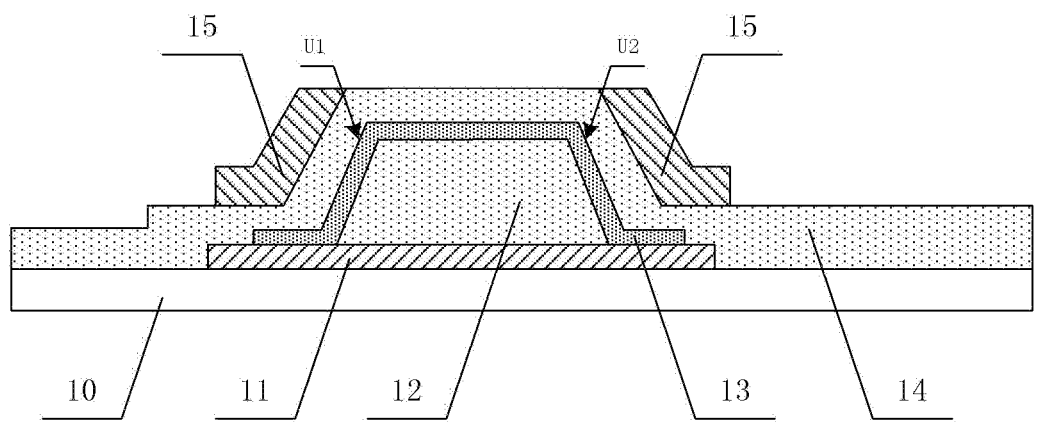
FIG. 13 is a sectional view after forming a gate electrode pattern during the process of manufacturing the thin film transistor shown in FIG. 9.

Next, patterns of the second insulating layer 14 and the control electrode 15 are formed on the active layer 13, as shown in FIG. 13. Specifically, forming patterns of the second insulating layer and the control electrode may comprise: depositing a second insulating film and a second metal film sequentially on the substrate on which the active layer is formed, and patterning the second insulating film and the second metal film using a patterning process, thereby forming a pattern of the second insulating layer 14 on the U-shaped portion 133 of the active layer 13 and a pattern of the control electrode 15 on the second insulating layer 14. Partial regions of the two control electrodes 15 correspond to the first channel portion U1 and the second channel portion U2 in the active layer 13, respectively, as shown in FIG. 13.

Figure 14:
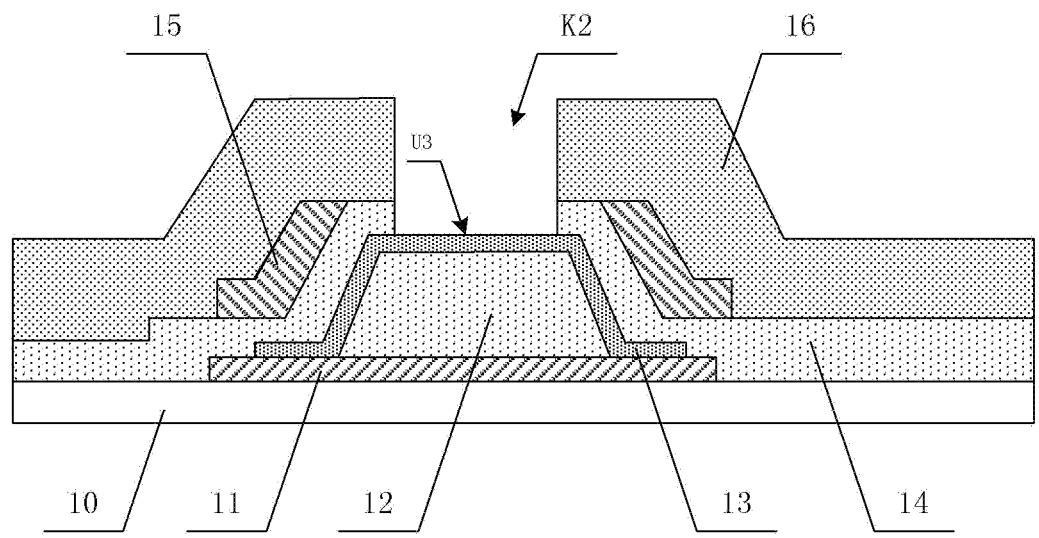
FIG. 14 is a sectional view after forming a third insulating layer pattern during the process of manufacturing the thin film transistor shown in FIG. 9.

Next, a pattern of the third insulating layer 16 having a via hole is formed on the control electrode 15, as shown in FIG. 14. Specifically, forming a pattern of the third insulating layer having a via hole may comprise: depositing a third insulating film on the substrate 10 on which the control electrode 15 is formed, and patterning the third insulating film by a patterning process, thereby forming a pattern of the third insulating layer 16 having a via hole K2. The position of the via hole K2 corresponds to the position of the internal extension portion U3 of the U-shaped portion 133 of the active layer 13 to expose the surface of the internal extension portion U3, as shown in FIG. 14.

Figure 15:
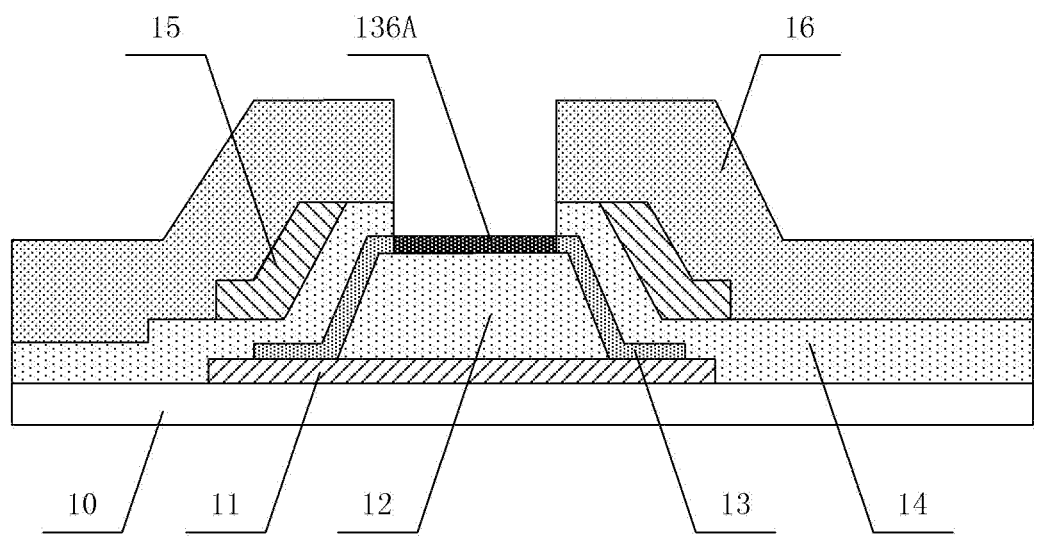
FIG. 15 is a sectional view after performing conductive treatment during the process of manufacturing the thin film transistor shown in FIG. 9.

Subsequently, the exposed internal extension portion U3 is subjected to conductive treatment so that it becomes conductive to form a conductive portion 136A, as shown in FIG. 15. Since the first channel portion U1 and the second channel portion U2 are covered by the third insulating layer 16, the first channel portion U1 and the second channel portion U2 of the active layer 13 do not become conductive.

Then, a pattern of the second electrode 17 is formed on the third insulating layer 16, as shown in FIG. 9. Specifically, forming a pattern of the second electrode may comprise: depositing a transparent conductive film on the substrate 10 on which the third insulating layer 16 is formed, and patterning the transparent conductive film by a patterning process to form a pattern of the second electrode 17 on the third insulating layer 16. The second electrode 17 is connected to the conductive portion 136A of the inverted U-shaped portion 136 of the active layer 13 through the via hole K2, as shown in FIG. 9. As in the previous embodiment, the second electrode 17 may be a transparent conductive electrode.

In this embodiment, the materials of the film layers and the process methods are the same as those in the previous embodiment, and details are not described herein again.

In case the thin film transistor shown in FIG. 9 is used in an array substrate, the second electrode 17 may be formed integrally with a pixel electrode of the array substrate. That is, a portion of the second electrode 17 is connected to the active layer 13 and functions as a drain electrode of the thin film transistor, and another portion of the second electrode 17 is connected to the drain electrode of the thin film transistor and functions as the pixel electrode of the array substrate. In this way, there is no need to connect the active layer and the pixel electrode separately using a metal material as in the prior art, so that the structure of the array substrate is simple, and the electrical connection relationships are simple, effective and reliable, which thus improves the electrical stability and the operating reliability of the thin film transistor and the array substrate.

In an exemplary embodiment, the first electrode 11 may be disposed in the same layer and formed by the same patterning process as the data line of the array substrate, and the first electrode 11 is connected to a data line. Further, the first electrode 11 formed of a metal material can also function as a light shielding layer to thereby prevent light from irradiating the active layer 13, thus ensuring stable properties of the thin film transistor.

In an exemplary embodiment, the control electrode 15 may be disposed in the same layer and formed by the same patterning process as the gate line of the array substrate, and the control electrode 15 is connected to a gate line.

In another embodiment according to the present disclosure, unlike the strip-shaped active layer 13 illustrated in FIG. 9, the section of the inverted U-shaped portion of the active layer in a direction parallel to the substrate has a circular shape, so that the channel portion of the inverted U-shaped portion has an annular three-dimensional structure, which is located on all of the sidewalls of the protrusion to form an annular three-dimensional channel connected between the first electrode and the second electrode.

Accordingly, different from the manufacturing process of the thin film transistor shown in FIG. 9, when the thin film transistor of this embodiment is being manufactured, the formed active layer covers all of the sidewalls of the protrusion. Specifically, the active layer includes an inverted U-shaped portion of an integral structure on the first insulating layer and a connection portion of an integral structure on the first electrode, wherein the connection portion realizes connection between the active layer and the first electrode. The inverted U-shaped portion includes a conductive portion on the top of the protrusion and a channel portion formed on all of the sidewalls of the protrusion, wherein the channel portion forms an annular three-dimensional channel on the protrusion. The conductive portion is formed by subjecting a semiconductor material to conductive treatment for realizing connection between the active layer and the second electrode. The annular three-dimensional channel is an integral structure, so the channel length in this embodiment is L.

In such an embodiment, the thin film transistor also has advantages such as greatly reducing the channel length, increasing the aperture ratio, being simple in structure and electrical connection relationships, reducing the number of patterning processes, having good process compatibility, significantly increasing the channel width to length ratio, and the like.

In an array substrate using the thin film transistor shown in FIG. 9, the first electrode on the substrate is a metal electrode, and the second electrode on the third insulating layer is a transparent electrode. The first electrode is formed by the same patterning process in the same layer as the data line, and the second electrode is also used as a pixel electrode. Alternatively, in a further embodiment according to the present disclosure, the first electrode on the substrate is a transparent electrode, and the second electrode on the third insulating layer is a metal electrode. Accordingly, in such an embodiment, the first electrode is also used as a pixel electrode, and the second electrode is formed by the same patterning process in the same layer as the data line.

In such an embodiment, the thin film transistor also has advantages such as greatly reducing the channel length, increasing the aperture ratio, being simple in structure and electrical connection relationships, reducing the number of patterning processes, having good process compatibility, significantly increasing the channel width to length ratio, and the like.

Figure 16:
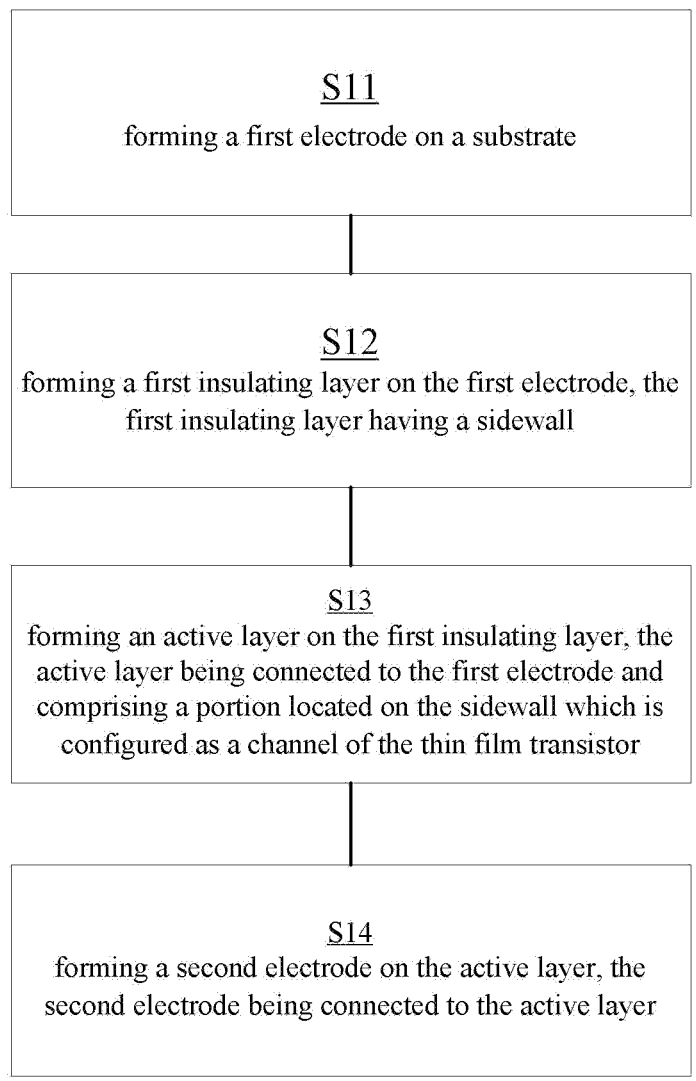
FIG. 16 is a flowchart of a method of manufacturing a thin film transistor according to an embodiment of the present disclosure.

An embodiment of the present disclosure further provides a method for manufacturing a thin film transistor, as shown in FIG. 16, comprising:

at step S11, forming a first electrode on a substrate;

at step S12, forming a first insulating layer on the first electrode, the first insulating layer having a sidewall;

at step S13, forming an active layer on the first insulating layer, the active layer being connected to the first electrode and comprising a portion located on the sidewall which is configured as a channel of the thin film transistor; and at step S14, forming a second electrode on the active layer, the second electrode being connected to the active layer.

In an exemplary embodiment, the above step S12 may specifically comprise forming a first insulating film on the first electrode; and patterning the first insulating film to form a groove exposing at least a portion of the first electrode. The above step S13 may specifically comprise forming a U-shaped portion within the groove; and forming a conductive portion outside the groove. The U-shaped portion includes a connection portion located at the bottom of the groove and connected to the first electrode, and a channel portion on a sidewall of the groove.

Alternatively, the above step S12 may specifically comprise forming a first insulating film on the first electrode; and patterning the first insulating film to form a protrusion exposing at least a portion of the first electrode. The above step S13 may specifically comprise forming an inverted U-shaped portion on the protrusion; and forming a connection portion on the first electrode. The inverted U-shaped portion includes a conductive portion on the top of the protrusion and a channel portion on a sidewall of the protrusion.

In an exemplary embodiment, one of the first electrode and the second electrode is made of an opaque metal material, and the other of the first electrode and the second electrode is made of a transparent conductive material.

An embodiment of the present disclosure further provides a display device comprising any of the array substrates described above. The display device may be a liquid crystal display (LCD) device or an organic light emitting diode (OLED) display device. The display device may be any product or component having a display function, such as a mobile phone, a tablet computer, a television, a display, a notebook computer, a digital photo frame, a navigator, and the like.

In the description of the embodiments of the present disclosure, it is to be understood that orientations or positional relationships indicated by the terms "middle", "upper", "lower", "front", "back", "vertical", "horizontal", "top", "bottom", "inside", "outside", etc. are based on the orientations or positional relationships shown in the drawings, which are merely intended to facilitate description of the present disclosure and simplify the description, rather than indicate or imply the indicated device or element must have a specific orientation, and be constructed and operated in a particular orientation, and thus cannot be construed as a limitation to the present disclosure.

In the description of the embodiments of the present disclosure, it is to be noted that, unless otherwise specified and defined, the terms "installation", "linking" and "connection" should be understood in a broad sense, which may be, for example, a fixed connection, a detachable connection, or an integral connection; a mechanical connection or an electrical connection; a direct connection or a connection via an intermediate medium; an internal communication between two elements. For a person having an ordinary skill in the art, the specific meanings of the above terms in the present disclosure can be understood according to specific circumstances.

In the description of the embodiments of the present disclosure, it is to be understood that "film" refers to a film made of a certain material on a substrate by depositing or other processes. If the "film" does not require a patterning process throughout the manufacturing process, the "film" may also be referred to as a "layer"; if the "film" further requires a patterning process throughout the manufacturing process, it is referred to as a "film" before the patterning process and as a "layer" after the patterning process. The "layer" after the patterning process comprises at least one "pattern".

Although embodiments disclosed by the present disclosure are described above, said contents are merely embodiments used to facilitate understanding of the present disclosure, rather than limit the present invention. Any person having a skill in the field to which the present disclosure pertains can make any modification and variation to the forms and details of implementation without departing from the spirit and scope revealed by the present disclosure. However, the protection scope of the present disclosure is still determined by the scope of the appended claims.

The invention claimed is:

1. An array substrate comprising a thin film transistor, wherein the array substrate comprises:
   a first electrode on a substrate;
   a first insulating layer on the first electrode, the first insulating layer having a sidewall;
   an active layer on the first insulating layer, wherein the active layer is connected to the first electrode, and wherein a portion of the active layer is on the sidewall of the first insulating layer and is configured as a channel of the thin film transistor; and
   a second electrode on the active layer, wherein the second electrode is connected to the active layer,
   wherein one of the first electrode and the second electrode is integrated with a pixel electrode of the array substrate, and
   wherein another of the first electrode and the second electrode is formed of a same material in a same layer as a data line of the array substrate.

2. The array substrate according to claim 1,
   wherein the first insulating layer has a groove exposing at least a first portion of the first electrode,
   wherein the active layer comprises a U-shaped portion within the groove and a conductive portion outside the groove, and
   wherein the U-shaped portion comprises a connection portion at a bottom of the groove and connected to the first electrode, and a channel portion on a sidewall of the groove.

3. The array substrate according to claim 2, further comprising:
   a second insulating layer on the U-shaped portion;
   a control electrode on the second insulating layer; and
   a third insulating layer on the control electrode, the third insulating layer having a via hole exposing the conductive portion,
   wherein the second electrode is on the third insulating layer and is connected to the conductive portion through the via hole.

4. The array substrate according to claim 3, wherein an orthographic projection of the second insulating layer, an orthographic projection of the control electrode, and an orthographic projection of the U-shaped portion on the substrate coincide with each other.

5. The array substrate according to claim 3,
   wherein the conductive portion comprises a first conductive portion and a second conductive portion on two sides of the groove,
   wherein the via hole in the third insulating layer comprises a first via hole exposing the first conductive portion and a second via hole exposing the second conductive portion, and
   wherein the channel portion of the U-shaped portion comprises a first channel portion on a sidewall of the groove close to the first conductive portion, and a second channel portion on a sidewall of the groove close to the second conductive portion.

6. The array substrate according to claim 2,
   wherein the groove has a shape selected from a group comprising a truncated pyramid, a truncated cone, and a column,
   wherein a sectional shape of the groove in a direction parallel to the substrate is selected from a group comprising a square, a rectangle, a circle and an ellipse, and wherein a sectional shape of the groove in a direction perpendicular to the substrate is selected from a group comprising a trapezoid and a rectangle.

7. The array substrate according to claim 2,
wherein the U-shaped portion overlaps all surfaces of the groove, and
wherein the U-shaped portion has an annular three-dimensional structure.

8. The array substrate according to claim 1,
wherein the first insulating layer has a protrusion exposing at least a second portion of the first electrode,
wherein the active layer comprises an inverted U-shaped portion on the protrusion and a connection portion on the first electrode, and
wherein the inverted U-shaped portion comprises a conductive portion on a top of the protrusion and a channel portion on a sidewall of the protrusion.

9. The array substrate according to claim 8, further comprising:
a second insulating layer on the active layer;
a control electrode on the second insulating layer, wherein a position of the control electrode corresponds to a position of the channel portion; and
a third insulating layer on the control electrode, wherein the third insulating layer has a via hole exposing the conductive portion,
wherein the second electrode is on the third insulating layer and is connected to the conductive portion through the via hole.

10. The array substrate according to claim 9, wherein the channel portion comprises a first channel portion and a second channel portion on two sides of the protrusion.

11. The array substrate according to claim 8,
wherein the protrusion has a shape selected from a group comprising a truncated pyramid, a truncated cone, and a column,
wherein a sectional shape of the protrusion in a direction parallel to the substrate is selected from a group comprising a square, a rectangle, a circle and an ellipse, and
wherein a sectional shape of the protrusion in a direction perpendicular to the substrate is selected from a group comprising a trapezoid and a rectangle.

12. The array substrate according to claim 8,
wherein the inverted U-shaped portion is on all surfaces of the protrusion, and
wherein the inverted U-shaped portion has an annular three-dimensional structure.

13. The array substrate according to claim 1,
wherein the thin film transistor further comprises a control electrode on the active layer,
wherein the control electrode is formed of a same material in a same layer as a gate line of the array substrate.

14. A display device comprising the array substrate according to claim 1.

* * * * *